(12) United States Patent
Moon

(10) Patent No.: US 6,189,765 B1
(45) Date of Patent: Feb. 20, 2001

(54) APPARATUS AND METHOD FOR DETECTING DOUBLE WIRE BONDING

(75) Inventor: Young Ku Moon, Ichon-shi (KR)

(73) Assignee: Hyundai Electronics Industries Co., Ltd., Ichon-shi (KR)

( * ) Notice: Under 35 U.S.C. 154(b), the term of this patent shall be extended for 0 days.

(21) Appl. No.: 09/290,246

(22) Filed: Apr. 13, 1999

(30) Foreign Application Priority Data

Apr. 14, 1998 (KR) .................................................. 98-13340

(51) Int. Cl.[7] .............................. B23K 37/04; B23K 35/00
(52) U.S. Cl. ........................... 228/102; 228/103; 228/10; 228/4.5; 228/180.5
(58) Field of Search ..................................... 228/102, 103, 228/105, 8–12, 180.5, 4.5

(56) References Cited

U.S. PATENT DOCUMENTS

| 4,301,958 | 11/1981 | Hatakenaka et al. . | |
|---|---|---|---|
| 4,555,052 | * 11/1985 | Kurtz et al. | 228/104 |
| 4,586,642 | 5/1986 | Dreibelbis et al. . | |
| 4,786,860 | 11/1988 | Zimmerman . | |
| 4,815,001 | * 3/1989 | Uthe et al. | 364/477 |
| 5,060,841 | * 10/1991 | Oshima et al. | 228/102 |
| 5,110,032 | * 5/1992 | Akiyama et al. | 228/102 |
| 5,180,094 | 1/1993 | Yanagida et al. . | |
| 5,340,011 | * 8/1994 | Sanchez | 228/4.5 |
| 5,351,872 | * 10/1994 | Kobayashi | 228/6.2 |
| 5,463,197 | 10/1995 | Miyazaki . | |
| 5,468,927 | * 11/1995 | Terakado | 219/56.21 |
| 5,566,876 | * 10/1996 | Nishimaki et al. | 228/102 |
| 5,645,210 | 7/1997 | Toner et al. . | |
| 5,988,482 | * 11/1999 | Sasakura et al. | 228/103 |

\* cited by examiner

Primary Examiner—Patrick Ryan
Assistant Examiner—Jonathan Johnson
(74) Attorney, Agent, or Firm—Jacobson, Price, Holman & Stern, PLLC

(57) ABSTRACT

The present invention is to provide an apparatus and a method for detecting a double bonding error that a wire ball is in contact with a wire loop previously formed between a pad and a lead, by using the position of the wire ball and comparing a reference voltage with the voltage on a wire when the wire ball is in contact with either the pad or the wire loop.

12 Claims, 5 Drawing Sheets

APPARATUS AND METHOD FOR DETECTING DOUBLE WIRE BONDING

FIELD OF THE INVENTION

The present invention relates to an apparatus and a method for detecting a double wire bonding; and, more particularly to the apparatus and the method capable of detecting a double bonding error when a wire ball is in contact with a previously formed wire loop.

DESCRIPTION OF THE PRIOR ART

FIG. 1 shows an exemplary structure illustrating a conventional wire bonding apparatus.

A wire spool 101 winds a wire, a guide 103 is for guiding the wire drawn from the wire spool 101 and a wire loop control unit 102 includes a sensor 104 for sensing whether the wire guided by the guide 103 exists at present.

A wire extractor 105 provides the wire with a tensile force and a wire clamp 106 clamps a wire position moved through the extractor 105, and a capillary 107 is positioned in a lower part of the wire clamp 106 and performs a wire bonding between a pad and a lead, and a transducer 108 drives the capillary 107.

Conventionally the lead frame having a structure of a complicated wire connection has been designed. Thus, because coordinates for connecting the lead and the pad acts as an important parameter, it is important to accurately connect the pad and the lead depending on coordinates established by a processor connected to the wire bonding apparatus, in a semiconductor assembly. When an arrangement sequence of pads and lead frames is established and then a wire bonding process is programmed, the wire bonding apparatus performs the wire bonding between the pad and the lead according to the programmed wire bonding process.

When the wire bonding apparatus performs the wire bonding process, a position arrangement of lead frames must be accurately accomplished so that the wire can be accurately connected at a bonding position of the pad and the lead.

However, unstable elements of a manufacturing process, such as a position error of bonding material and an error of the lead frame arrangement by an unskilled workman, may result in the lead frame being reloaded, and errors of the wire bonding apparatus such as an index error, a wire break and so on, may result in work manipulation mistakes.

Because of those errors as described above, the case where a position for the wire bonding of the pad and the lead is beyond an allowance error may occur. According to the work manipulation mistakes, the case where the lead frame is not positioned at the accurate coordinate may occur. Thus, due to these errors and work manipulation mistakes, a bonding coordinate different from the coordinate established by the processor may be set on a display and a camera for monitoring a wire bonding state may not sense the wire bonding state.

Furthermore, the wire bonding can be carried out once more at the same coordinate of the pad on which the wire bonding has been previously performed and consequently, there is a problem in that a double wire bonding may occur.

Because the wire bonding apparatus itself may not detect errors of the wire bonding. Such a problem may occur resulting in the producing a small or large amount of bad products in a production process.

SUMMARY OF THE INVENTION

Therefore, an object of the present invention is to provide an apparatus and a method for detecting a double bonding error that a wire ball is in contact with a wire loop previously formed between a pad and a lead, by using the position of the wire ball and comparing a reference voltage with the voltage on a wire when the wire ball is in contact with either the pad or the wire loop.

In accordance with a first aspect of the present invention, there is provided a wire bonding apparatus having a wire spool for providing a wire, a high voltage torch for forming a wire bonding ball on an end of the wire, a capillary for determining a position of the wire bonding ball and x,y and z-axis drivers for moving the capillary, the wire bonding apparatus comprising: a first means for applying a voltage to the wire and for forming a closed loop through the voltage applied wire and the wire bonding ball; and a second means for detecting a double bonding error using a voltage signal from the closed loop and present position of the wire bonding ball on a z-axis.

In accordance with a second aspect of the present invention, there is provided a wire bonding apparatus comprising: a bonding means for forming a wire bonding ball from a wire fed from a wire spool and for bonding the wire between a pad and a lead of a semiconductor device; a voltage supplying means for applying a voltage to the wire; a first comparing means for comparing a predetermined voltage with the voltage applied to the wire when the wire bonding ball formed by the bonding means is in contact with either the pad or a wire loop which is previously formed at a preceding wire bonding process; a detector for providing height of the wire bonding ball at a present position; a second comparing means for comparing a predetermined height with a present height of the wire bonding ball in response to an output from the first comparing means in order to prevent a double wire bonding from being generated; and a driving means for moving position of the wire bonding ball when the height of the wire bonding ball is more than the predetermined height.

In accordance with a third aspect of the present invention, there is provided a method for detecting a double wire bonding, comprising steps of: descending a capillary to form a wire bonding ball on an end of a wire and perform a wire bonding; determining whether a voltage applied to the wire exists, comparing the applied voltage with a reference voltage and outputting a compared result signal in a first comparator; determining whether the compared result signal is either a low level signal or a high level signal; performing a normal wire bonding if the compared result signal is the high level signal; and receiving the present position of the wire bonding ball if the compared result signal is the low level signal and detecting a double bonding error when the wire bonding ball has been contacted to either the pad or a wire loop in a second comparator.

BRIEF DESCRIPTION OF THE DRAWINGS

This invention can be more fully understood from the following detailed description when taken in conjunction with the accompanying drawings, in which.

DETAILED DESCRIPTION OF THE INVENTION

Hereafter, the present invention will be described in detail with reference to the accompanying drawings.

Figure 1:
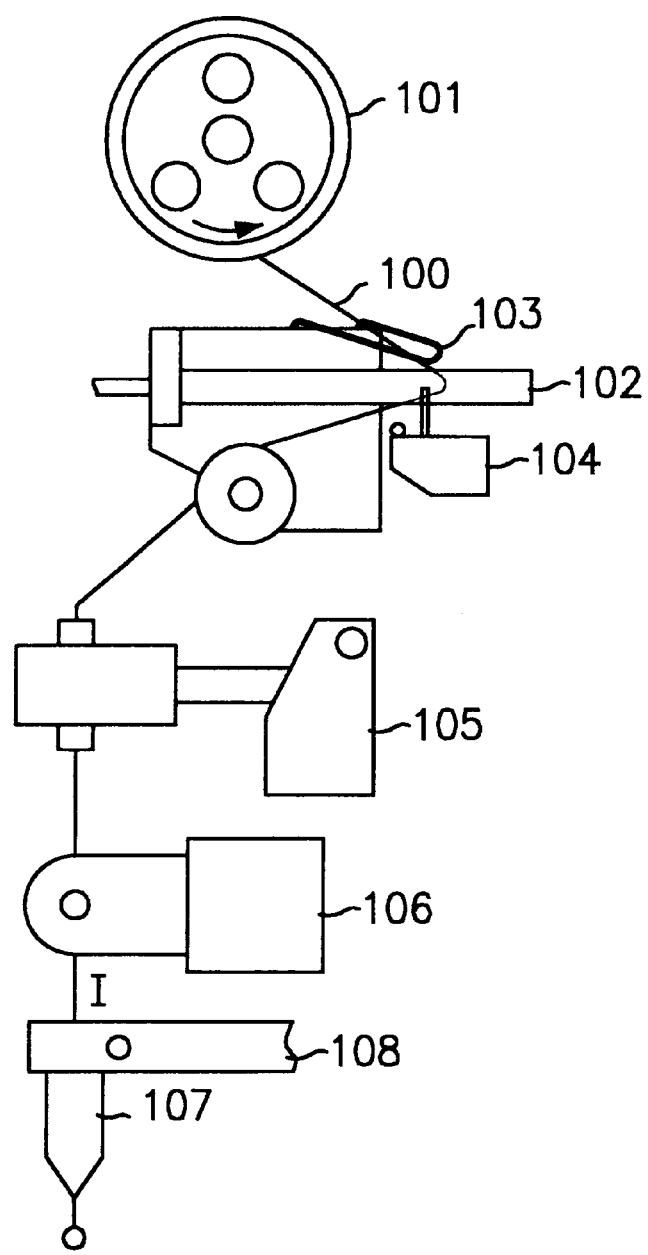
FIG. 1 shows a schematic view illustrating a conventional wire bonding apparatus.
Figure 2:
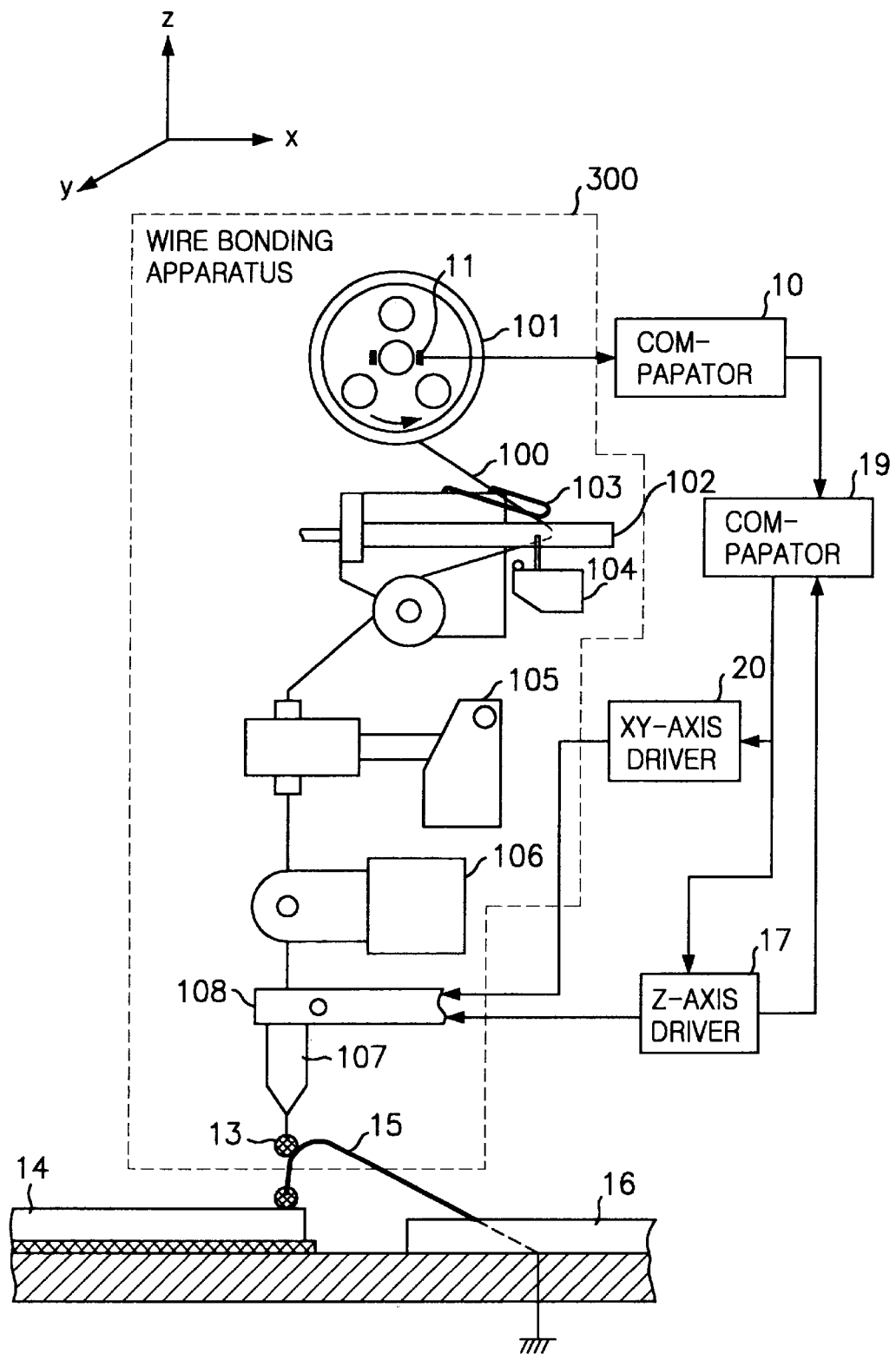
FIG. 2 shows an exemplary structure illustrating an apparatus for detecting a double wire bonding according to the present invention.

FIG. 2 shows a schematic view illustrating an apparatus for detecting a double wire bonding according to the present invention and the parts shown in FIG. 2 which are the same as those in FIG. 1 have the same numerals.

As shown in FIG. 2, a capillary 107 of a wire bonding apparatus 300 takes a wire fed from a wire spool 101 to form a wire ball 13 and performs a wire bonding between a pad 14 and a lead 16.

As compared with the conventional wire bonding apparatus in FIG. 1, the wire bonding apparatus 300 in accordance with the present invention forms closed loops through the wire wound round the wire spool 101. In other words, a voltage is applied to the wire by a voltage provider (not shown). The end of the wire is connected to a comparator 10 through a contact terminal 11 and the comparator 10 compares the voltage on the wire with a reference voltage. The closed loops are formed in two cases: 1) when the wire ball 13 formed at the end of the wire is in contact with a wire loop 15 which has been already formed between the pad 14 and the lead 16; and 2) when the wire ball 13 is in contact with the surface on the pad 14.

On the other hand, there are two cases according to the voltage level of the pad 14, one of which may occur when the pad 14 is short to the ground voltage level and the other of which may occur when the pad 14 is not short to the ground voltage level.

Accordingly, the input signal of the comparator 10 is in a low level except that the pad 14 is not short to the ground voltage level.

Furthermore, the present position of the wire ball 13 may be provided by a z-axis driver and also it can be possible to detect the present position of the wire ball 13 using a position detector (not shown).

When the wire ball 13 is in contact with the surface on the pad 14 which is not short to the ground voltage level, a high voltage level is inputted into the comparator 10 and then a normal bonding operation is carried out at the present position of the wire ball 13.

When the wire ball 13 is in contact with the surface on the pad 14 which is short to the ground voltage level and the wire ball 13 is in contact with the wire loop 15 previously formed at the preceding wire bonding operation, a low voltage level is inputted into the comparator 10 and then the comparator 19 compares a predetermined height value with the present position of the wire ball 13. If the present position of the wire ball 13 is lower than the predetermined height, the wire bonding apparatus 300 carries out a normal bonding operation at the present position of the wire ball 13. However, if the position of the wire ball 13 is higher than the predetermined height, the apparatus for detecting a double wire bonding may sense a double bonding error. Although the present position of the wire ball 13 is higher than the predetermined height, the voltage on the wire can be in a low voltage because the wire ball 13 is electrically connected to the previously formed wire loop 15. In this case, the apparatus for detecting a double wire bonding considers the present position as a double bonding position and moves the capillary 107 based on the programmed position data.

As a result, the apparatus for detecting a double wire bonding in accordance with the present invention detects a double bonding by applying a voltage to the wire and by considering the present position of the capillary.

According to the result compared by the comparator 19, the z-axis driver 17 and xy-axis driver 20 move the capillary 107 of the wire bonding apparatus 300 on x, y and z axes in order to correct the position of the capillary 107.

Figure 3:
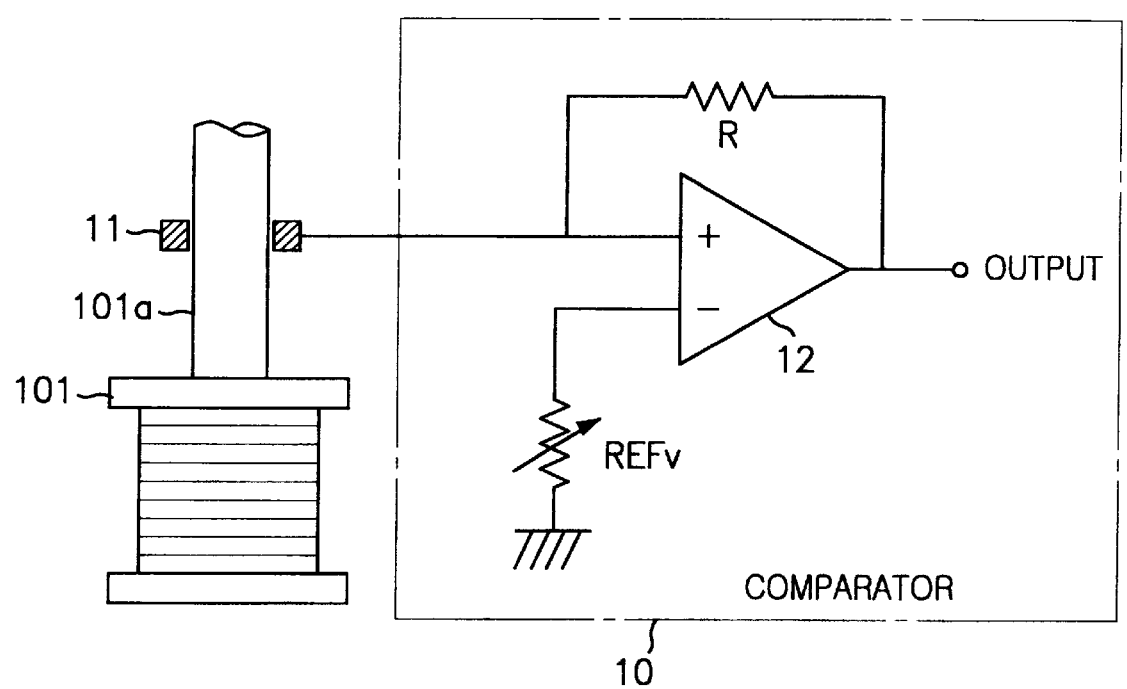
FIG. 3 shows a schematic diagram illustrating a comparator 10 of FIG. 2.

FIG. 3 shows a schematic diagram illustrating a comparator 10 of FIG. 2.

As shown in FIG. 3, an electrical contact terminal 11 is on a round surface of an axis 101a of a wire spool 101 and connects to an end of a wire. When a wire ball is in contact with a pad or a wire loop, the contact terminal 11 outputs a voltage applied from a wire bonding apparatus to a comparator 10.

The comparator 10 includes an operational amplifier 12 having an inverting input terminal and a non-inverting input terminal. The voltage applied from the contact terminal 11 is inputted to the non-inverting input terminal of the operational amplifier 12 and a reference voltage is inputted to the inverting input terminal of the operational amplifier 12. Thus, the comparator 10 compares the reference voltage with the voltage applied from the contact terminal 11 and then outputs a compared result signal to the comparator.

In similar to the comparator 10, the comparator 19 made up for the operational amplifier 12 receives the present position data of the capillary on z-axis and compares the predetermined height with the capillary position.

Figure 4:
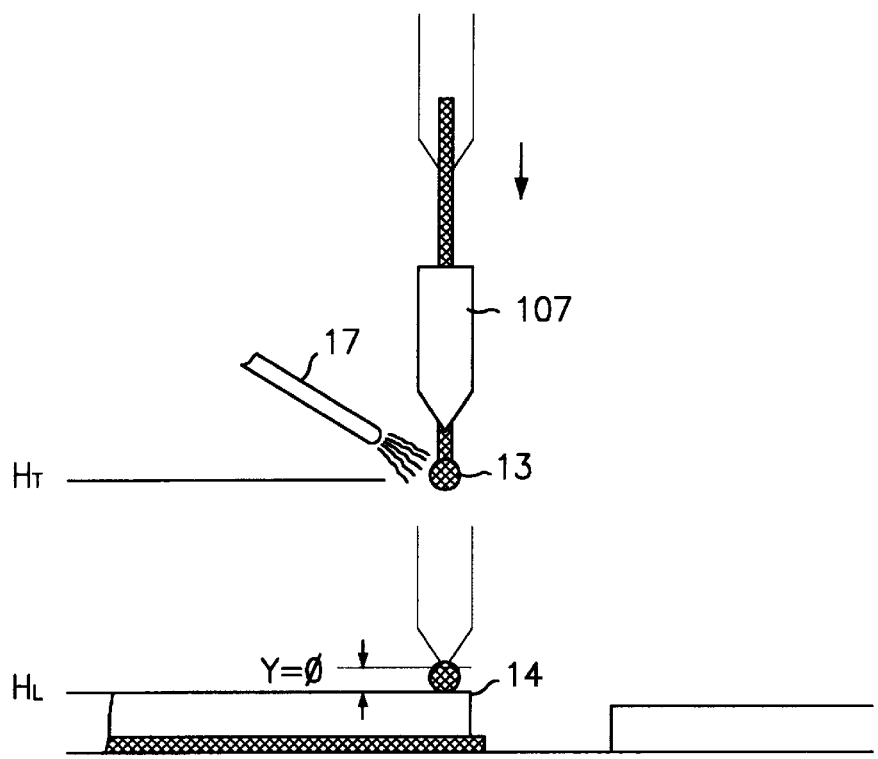
FIG. 4 illustrates a state that a wire ball is in contact with a pad.

Referring to FIG. 4, a high voltage torch 17 forms a wire ball 13 on an end of a wire drawn from a capillary 107 at point $H_J$. When the capillary 107 descends, the wire ball 13 comes in contact with a pad 14 at point $H_L$.

Figure 5:
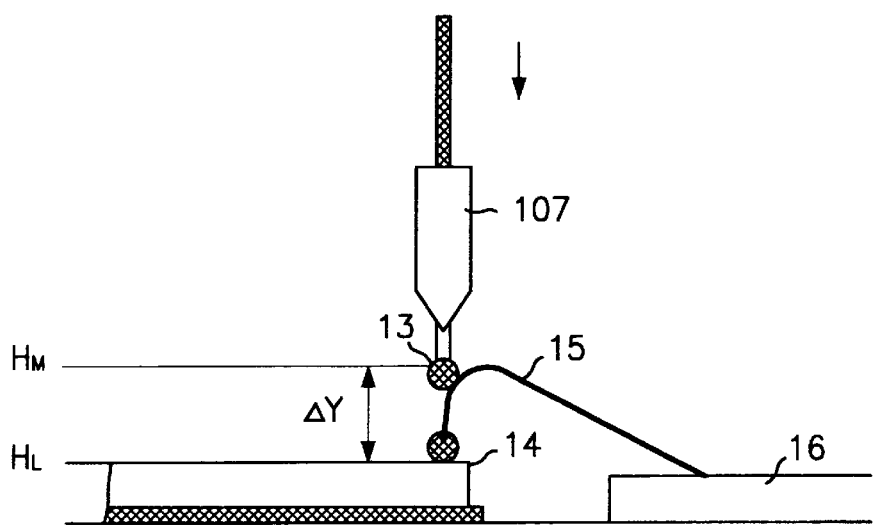
FIG. 5 illustrates a state that a wire ball is in contact with a wire loop between a pad and a lead.

Referring to FIG. 5, when a capillary descends, a wire ball 13 comes in contact with a wire loop previously formed between a pad 14 and a lead 16, at point $H_M$ spaced by height $\Delta Y$. In this case, if the height is larger than the predetermined height of the comparator 19, a double bonding error is detected.

Figure 6:
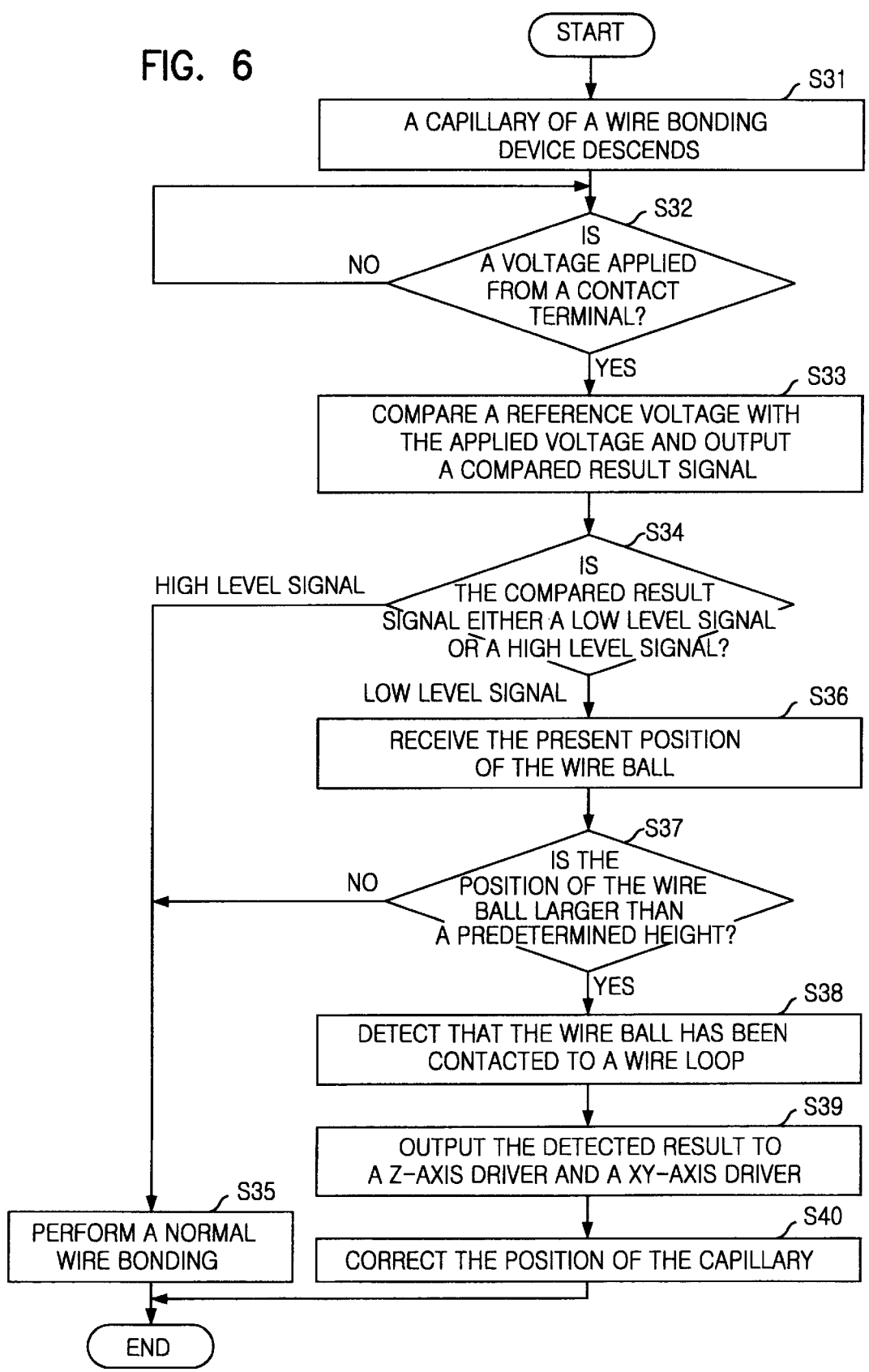
FIG. 6 is a flowchart illustrating a method for detecting a double wire bonding according to the present invention.

FIG. 6 is a flowchart illustrating a method for detecting a double wire bonding according to the present invention.

At step S31, a capillary of a wire bonding apparatus descends to form a wire ball on an end of a wire and then perform a wire bonding as shown in FIG. 4.

At step S32, a first comparator determines whether a voltage inputted from a contact terminal which connects to the wire exists.

At step S33, if the voltage applied from the contact terminal exists, the first comparator compares the applied voltage with a reference voltage and then outputs a compared result signal.

At step S34, a second comparator determines whether the compared result signal is either a low level signal or a high level signal.

At step S35, if the result signal is the high level signal, the wire bonding apparatus performs a normal wire bonding.

At step S36, if the compared result signal is the low level signal, the second comparator receives the present position of the wire ball in order to detect a double bonding when the wire ball has been contacted to either a pad or a wire loop.

At step S37, the second comparator determines whether the present position of the wire ball is larger than a predetermined height.

At step S38, if the position of the wire ball is larger than the predetermined height, the second comparator detects that the wire ball has been contacted to the wire loop.

At step S39, the second comparator outputs the detected result to a z-axis driver and a xy-axis driver so that a position of the capillary can be corrected.

At step S40, the z-axis driver and the xy-axis driver correct the position of the capillary.

Therefore, an apparatus and method for detecting a double wire bonding according to the present invention may detect a double bonding error when a new wire ball is in contact with a wire loop previously formed between a pad and a lead, thereby allowing a z-axis driver and a xy-axis driver to correct a capillary position, performing a wire bonding reliably and improving the production yield of semiconductor assembly.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A wire bonding apparatus for detecting double wire bonding having a wire spool for providing a wire, a high voltage torch for forming a wire bonding ball on an end of the wire, a capillary for positioning the wire bonding ball and x,y and z-axis drivers for moving the capillary, the wire bonding apparatus comprising:

a first means for applying a voltage to the wire and for forming a closed loop through the voltage applied wire and the wire bonding ball;

a first comparator for comparing an output from the closed loop with a reference voltage and for outputting a compared result signal;

a second comparator, coupled to said first comparator, for receiving the compared result signal and, in response to the compared result signal indicating a low level voltage, said second comparator comparing a present height of the wire bonding ball with a predetermined height; and said x,y and z-axis drivers, responsive to said present position being higher than said predetermined height, for moving the capillary to a correct position.

2. The wire bonding apparatus in accordance with claim 1, wherein the closed loop is formed between the first means and a semiconductor device connected to a ground voltage level.

3. The wire bonding apparatus in accordance with claim 2, wherein the second comparator receives the present height only when the compared result signal indicates a low level voltage.

4. The wire bonding apparatus in accordance with claim 1, wherein the present height of the wire bonding ball is provided by the z-axis driver.

5. The wire bonding apparatus in accordance with claim 1, wherein the present height of the wire bonding ball is provided by a position detector.

6. A wire bonding apparatus for detecting double wire bonding comprising:

a bonding means for forming a wire bonding ball from a wire fed from a wire spool and for bonding the wire between a pad and a lead of a semiconductor device;

a voltage supplying means for applying a voltage to the wire;

a first comparing means for comparing a predetermined voltage with the voltage applied to the wire when the wire bonding ball formed by the bonding means is in contact with either the pad or a wire loop which is previously formed at a preceding wire bonding process;

a detector for providing height of the wire bonding ball at a present position;

a second comparing means for receiving, in response to an output from the first comparing means indicating a low level voltage signal, a present height of the wire bonding ball from the detector and for comparing a predetermined height with the present height of the wire bonding ball; and a driving means for moving a position of the wire bonding ball when the present height of the wire bonding ball is higher than the predetermined height.

7. The wire bonding apparatus in accordance with claim 6, the driving means including an x,y axis driver for horizontally moving the wire bonding ball.

8. The wire bonding apparatus in accordance with claim 7, wherein the first comparing means compares the predetermined voltage with a low level voltage applied to the wire and outputs a low level voltage signal to the second comparing means when the pad is shorted to the ground voltage level and the wire bonding ball is in contact with the pad.

9. The wire bonding apparatus in accordance with claim 7, wherein the first comparing means compares the predetermined voltage with a high level voltage applied to the wire and outputs a high level voltage signal to the second comparing means when the pad is not shorted to the ground voltage level and the wire bonding ball is in contact with the pad.

10. The wire bonding apparatus in accordance with claim 7, wherein the first comparing means compares the predetermined voltage with a low level voltage applied to the wire and outputs a low level voltage signal to the detector when the wire loop is shorted to the ground voltage level and the wire bonding ball is in contact with the wire loop.

11. The wire bonding apparatus in accordance with claim 6, wherein the detector provides data to a vertical z-axis driver of the driving means.

12. A method for detecting a double wire bonding, comprising the steps of:

(a) descending a capillary to form a wire bonding ball on an end of a wire and perform a wire bonding;

(b) determining whether a voltage applied to the wire exists and, responsive to an applied voltage, comparing the applied voltage with a reference voltage and outputting a compared result signal to a first comparator;

(c) determining, by the first comparator, whether the compared result signal is either a low level signal or a high level signal, the low level signal indicating that the wire bonding ball is in contact with the pad or the wire loop;

(d) performing a normal wire bonding if the compared result signal is the high level signal;

(e) receiving, at a second comparator, a present position of the wire bonding ball if the compared result signal is the low level signal;

(f) comparing, by the second comparator, the present position with a predetermined height;

(g) detecting, responsive to the present position being higher than the predetermined height, that the wire bonding ball has contacted the wire loop;

(h) outputting the detected result to a z-axis driver and an xy-axis driver so that a position of the capillary can be corrected; and (i) correcting the position of the capillary.

* * * * *